(12) United States Patent
Sakaguchi et al.

(10) Patent No.: US 10,217,788 B2
(45) Date of Patent: Feb. 26, 2019

(54) IMAGING DEVICE

(71) Applicants: Shinji Sakaguchi, Osaka (JP); Tohru Kanno, Osaka (JP)

(72) Inventors: Shinji Sakaguchi, Osaka (JP); Tohru Kanno, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 153 days.

(21) Appl. No.: 15/438,224

(22) Filed: Feb. 21, 2017

(65) Prior Publication Data

US 2017/0256580 A1   Sep. 7, 2017

(30) Foreign Application Priority Data

Mar. 1, 2016  (JP) ................................. 2016-039073
Dec. 27, 2016  (JP) ................................. 2016-254058

(51) Int. Cl.

| | | |
|---|---|---|
| *H04N 5/335* | (2011.01) | |
| *H01L 27/146* | (2006.01) | |
| *H04N 9/04* | (2006.01) | |
| *H04N 5/374* | (2011.01) | |
| *H01L 27/148* | (2006.01) | |
| *H04N 5/353* | (2011.01) | |
| *H04N 5/359* | (2011.01) | |

(52) U.S. Cl.
CPC .. *H01L 27/14645* (2013.01); *H01L 27/14868* (2013.01); *H04N 5/3535* (2013.01); *H04N 5/3537* (2013.01); *H04N 5/3597* (2013.01); *H04N 5/374* (2013.01); *H04N 9/045* (2013.01)

(58) Field of Classification Search
CPC .......................... H04N 5/374; H01L 27/14645
USPC ........................................................ 348/294
See application file for complete search history.

(56) References Cited

U.S. PATENT DOCUMENTS

| | | |
|---|---|---|
| 7,427,736 B2 | 9/2008 | Xu et al. |
| 8,085,321 B2 | 12/2011 | Xu et al. |
| 8,358,881 B2 | 1/2013 | Hillis et al. |
| 8,369,659 B2 | 2/2013 | Hillis et al. |

(Continued)

FOREIGN PATENT DOCUMENTS

| | | |
|---|---|---|
| JP | 04-347971 | 12/1992 |
| JP | 2006-191236 | 7/2006 |

(Continued)

*Primary Examiner* — Usman A Khan
(74) *Attorney, Agent, or Firm* — Oblon, McClelland, Maier & Neustadt, L.L.P.

(57) ABSTRACT

An imaging device includes a plurality of arranged imaging elements each including: a light-receiving element configured to generate charge from received light by photoelectric conversion, a floating diffusion configured to convert the charge generated by the light-receiving element into voltage, a charge transfer switch configured to transfer the charge from the light-receiving element to the floating diffusion, a reset switch configured to reset the voltage of the floating diffusion, and a source follower configured to amplify the voltage of the floating diffusion. The reset switch is configured to reset the voltage of the floating diffusion a plurality of times for each of predetermined pixel groups in a single image data acquisition period. The charge transfer switch is configured to transfer the charge from the light-receiving element to the floating diffusion a plurality of times for each of the pixel groups in the single image data acquisition period.

9 Claims, 5 Drawing Sheets

(56) References Cited

U.S. PATENT DOCUMENTS

| | | |
|---|---|---|
| 2006/0157760 A1 | 7/2006 | Hayashi et al. |
| 2007/0223858 A1 | 9/2007 | Hillis et al. |
| 2007/0223866 A1 | 9/2007 | Hillis et al. |
| 2008/0062290 A1* | 3/2008 | Lahav ............... H01L 27/14621 348/280 |
| 2008/0112663 A1 | 5/2008 | Hillis et al. |
| 2009/0127436 A1* | 5/2009 | Johnson ............ H01L 27/14656 250/208.1 |
| 2011/0190167 A1 | 8/2011 | Hillis et al. |

FOREIGN PATENT DOCUMENTS

| | | |
|---|---|---|
| JP | 2009-530978 | 8/2009 |
| JP | 2011-066852 | 3/2011 |
| JP | 2013-106231 | 5/2013 |
| WO | WO 2007/111854 | 10/2007 |

* cited by examiner

IMAGING DEVICE

CROSS-REFERENCE TO RELATED APPLICATIONS

The present application claims priority under 35 U.S.C. § 119 to Japanese Patent Application No. 2016-039073, filed Mar. 1, 2016, and Japanese Patent Application No. 2016-254058, filed Dec. 27, 2016. The contents of which are incorporated herein by reference in their entirety.

BACKGROUND OF THE INVENTION

1. Field of the Invention

The present invention relates to an imaging device.

2. Description of the Related Art

Imaging devices such as complementary metal oxide semiconductor (CMOS) linear image sensors read image data at certain rates. For example, a photodiode in each pixel accumulates charge by photoelectric conversion and the accumulated charge is transferred to a floating diffusion at certain timing, and the charge retained in the floating diffusion is read as image data. The following describes examples of pixel data read-out techniques of comparative imaging devices.

For example, Japanese Unexamined Patent Application Publication No. 2006-191236 discloses a solid-state image sensor that simultaneously resets pixel signals for all the rows before exposure, closes a mechanical shutter after a predetermined exposure period is elapsed, and sequentially reads the pixel signals for each row with the mechanical shutter being closed.

Japanese Unexamined Patent Application Publication No. 2013-106231 discloses an imaging device that reads a reset level of each floating diffusion and then reads charge transferred to the floating diffusion as a signal level, and calculates a difference between the signal level and the reset level.

WO2007/111854 discloses an imaging device that performs rolling shutter reset of a plurality of storage nodes such that the plurality of storage nodes are reset before charge is transferred from photosensors.

Japanese Unexamined Patent Application Publication No. 2011-066852 discloses a technique for the evaluation of linearity of an electric shutter before shipping of the product. In this technique, pixel data is output from each row while increasing exposure time in the arrangement order, and the linearity is evaluated from the characteristics that represent a relation between the exposure time of pixel data and an output level of the pixel data.

However, such comparative techniques does not set an individual accumulation period for each pixel group and keep the condition of the floating diffusion at a certain level at the time of starting the transfer of charge. If charge is transferred to a floating diffusion that still has a residue charge and is not in a reset state, the floating diffusion, which cannot store more charge than the storage capacity, may fail to receive all the generated charge transferred from a photodiode. In this case, charge remains in the photodiode, and the residue charge is added to newly generated charge in a next accumulation period, resulting in a difference between the actual object to be imaged and the image data that images the object.

SUMMARY OF THE INVENTION

According to one aspect of the present invention, an imaging device includes a plurality of arranged imaging elements. Each of the plurality of imaging elements includes a light-receiving element, a floating diffusion, a charge transfer switch, a reset switch, and a source follower. The light-receiving element is configured to generate charge from received light by photoelectric conversion. The floating diffusion is configured to convert the charge generated by the light-receiving element into voltage. The charge transfer switch is configured to transfer the charge from the light-receiving element to the floating diffusion. The reset switch is configured to reset the voltage of the floating diffusion. The source follower is configured to amplify the voltage of the floating diffusion. The reset switch is configured to reset the voltage of the floating diffusion a plurality of times for each of predetermined pixel groups in a single image data acquisition period. The charge transfer switch is configured to transfer the charge from the light-receiving element to the floating diffusion a plurality of times for each of the pixel groups in the single image data acquisition period.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENT

Figure 1:
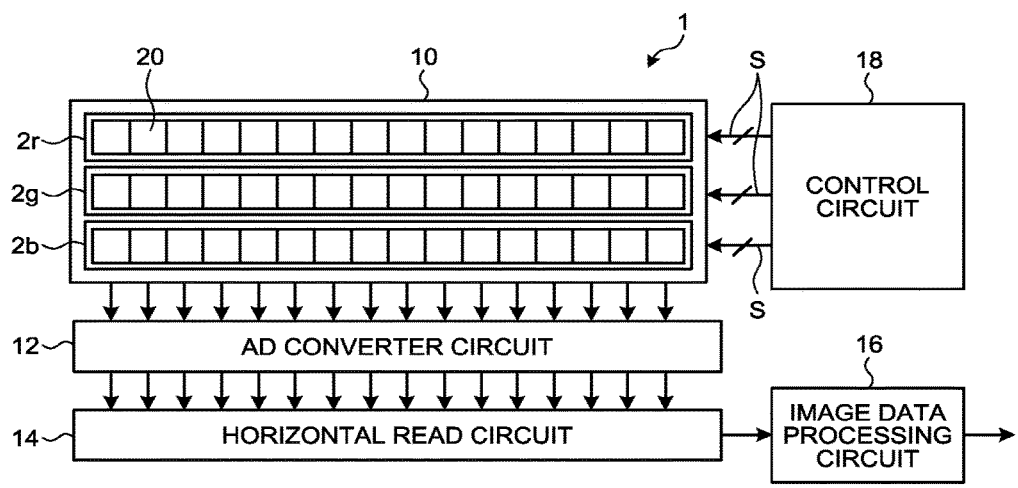
FIG. 1 is a diagram illustrating an example of a configuration of an imaging device according to an embodiment of the present invention.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

An embodiment has an object to provide an imaging device that can correct differences in pixel sensitivity among pixel groups and can reduce the influence of charge generated during a non-imaging period.

An imaging device according to an embodiment of the present invention is now described in detail with reference to the accompanying drawings. FIG. 1 is a diagram illustrating an example of a configuration of this imaging device 1 according to the embodiment. The imaging device 1 is, for example, a CMOS color linear sensor and includes an imaging element block 10, an analog-to-digital (AD) converter circuit 12, a horizontal read circuit 14, an image data processing circuit 16, and a control circuit 18. In the following description, a term "imaging element" indicates any one of pixels that constitute the imaging device 1. A subset of a plurality of imaging elements, that is, a subset of a plurality of pixels is referred to as a "pixel group".

The imaging element block 10 is an area including a plurality of arrayed imaging elements 20. FIG. 1 illustrates, for example, a three-row array of the imaging elements 20. Color filters 2r, 2g, and 2b are placed above the imaging elements 20 (in the forward direction with respect to the surface of FIG. 1) in the first row, the second row, and the third row of the imaging element block 10, respectively. In other words, the imaging element block 10 includes a pixel group provided with the color filter 2r in the first row, a pixel group provided with the color filter 2g in the second row, and a pixel group provided with the color filter 2b in the third row.

The pixel groups receive red (R) light, green (G) light, and blue (B) light through color filters (through the color filters 2r, 2g, and 2b, respectively) provided above the pixel groups and accumulate photo-generated charge therein. The imaging elements 20 in each pixel group output pixel signals based on the charge generated in an accumulation period set for the pixel group. The pixel signals constitute the pixels of image data. The "accumulation period", which will be described later, indicates a period for accumulating charge in a light-receiving element in each imaging element 20 that corresponds to a pixel of the image data.

The AD converter circuit 12 has a column configuration in which AD conversion is performed, column by column, on the voltages (pixel signals) output from the imaging elements 20. After AD conversion, the AD converter circuit 12 outputs digital pixel signals in RGB colors to the horizontal read circuit 14. The horizontal read circuit 14 performs parallel-to-serial conversion on the digital RGB pixel signals input from the AD converter circuit 12, and outputs the signals to the image data processing circuit 16. The image data processing circuit 16 performs image processing such as correction processing on the digital RGB signals (that is, image data) input from the horizontal read circuit 14, and outputs the processed signals to the outside.

The control circuit 18 (an example of a control unit) controls the units that constitute the imaging device 1. For example, the control circuit 18 outputs control signals S to switches SEL, TX, and RT (see FIG. 2) in each imaging element 20 to control the switches between on and off. Examples of the control signals S include SRT 31, 33, and 35 (see FIG. 3) for controlling the RT 206, STX 32, 34, and 36 (see FIG. 3) for controlling the TX 202, and SSEL 30 (see FIG. 3) for controlling the SEL 210. Details of these switches and how the switches are controlled will be described later.

The control circuit 18 also controls the AD converter circuit 12, the horizontal read circuit 14, and the image data processing circuit 16, for example. The control target of the control circuit 18 may be set as appropriate.

Figure 2:
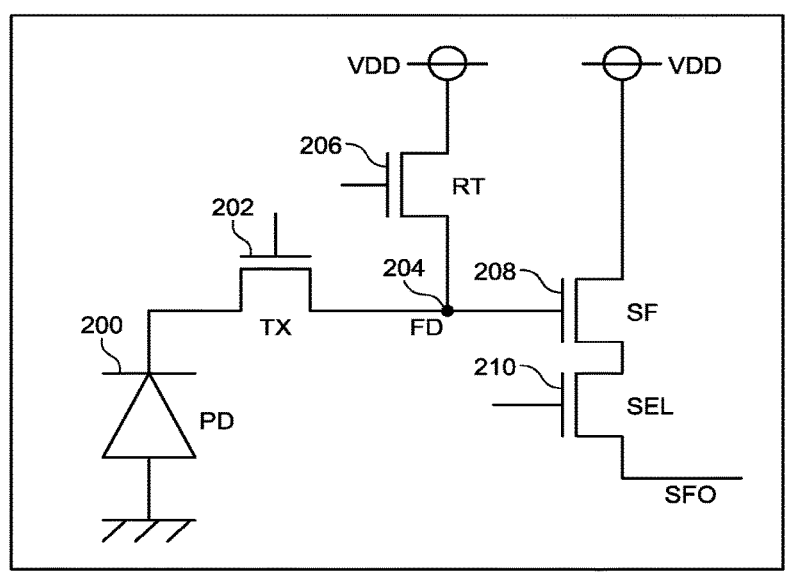
FIG. 2 is a diagram illustrating an example of a configuration of an imaging element.

FIG. 2 is a diagram illustrating an example of a configuration of an imaging element 20. FIG. 2 illustrates, an element of the four transistor configuration, as an example of the imaging element 20, including a photodiode (PD) 200, a charge transfer switch (TX) 202, a floating diffusion (FD) 204, a reset switch (RT) 206, a source follower circuit (SF) 208, and a selection control switch (SEL) 210. The PD 200 is an example of a "light-receiving element". The PD 200 photoelectrically converts received light to generate charge, and accumulates the charge in accordance with the amount of received light. The PD 200 is, for example, a pinned photodiode. The TX 202, RT 206, SF 208, and SEL 210 form the four transistor configuration (MOS field effect transistors (MOSFET), for example). The following describes circuit connection in the imaging element 20.

The anode of the PD 200 is grounded and the cathode is connected to the drain of the TX 202. The drain of the TX 202 is connected to the cathode of the PD 200 and the source is connected to the FD 204. The drain of the RT 206 is connected to the voltage VDD and the source is connected to the FD 204. The gate of the SF 208 is connected to the FD 204, the drain is connected to the voltage VDD, and the source is connected to the drain of the SEL 210. The drain of the SEL 210 is connected to the source of the SF 208, and a pixel signal (voltage) is output from the source to the AD converter circuit 12 (see FIG. 1).

The control circuit 18 (see FIG. 1) applies pulsed voltage to the gates of the TX 202, RT 206, and SEL 210 as a control signal S (see FIG. 1) to operate the imaging element 20.

The following describes the basic operation of the imaging element 20. First, the PD 200 performs photoelectric conversion to generate and accumulate charge in accordance with an amount of received light. The charge accumulated in the PD 200 is transferred from the PD 200 to the FD 204 by turn-on of the TX 202. The FD 204 converts the charge generated by the PD 200 into voltage. Specifically, the FD 204 retains the signal charge transferred from the PD 200 via the TX 202. The FD 204 then converts the retaining signal charge into a signal level of the voltage and outputs the signal level to apply the signal level to the SF 208.

The SF 208 operates in the following manner by turn-on of the SEL 210. The SF 208 amplifies the signal level of the voltage of the FD 204 and outputs the amplified voltage as a pixel signal (voltage) SFO. After the signal level of the FD 204 is output as the SFO, the signal level of the FD 204 is reset by turn-on of the RT 206, and is initialized to a certain level. The pixel signal SFO passes through the AD converter circuit 12 and the horizontal read circuit 14, thereby being output as image data.

First Operating Example

Figure 3:
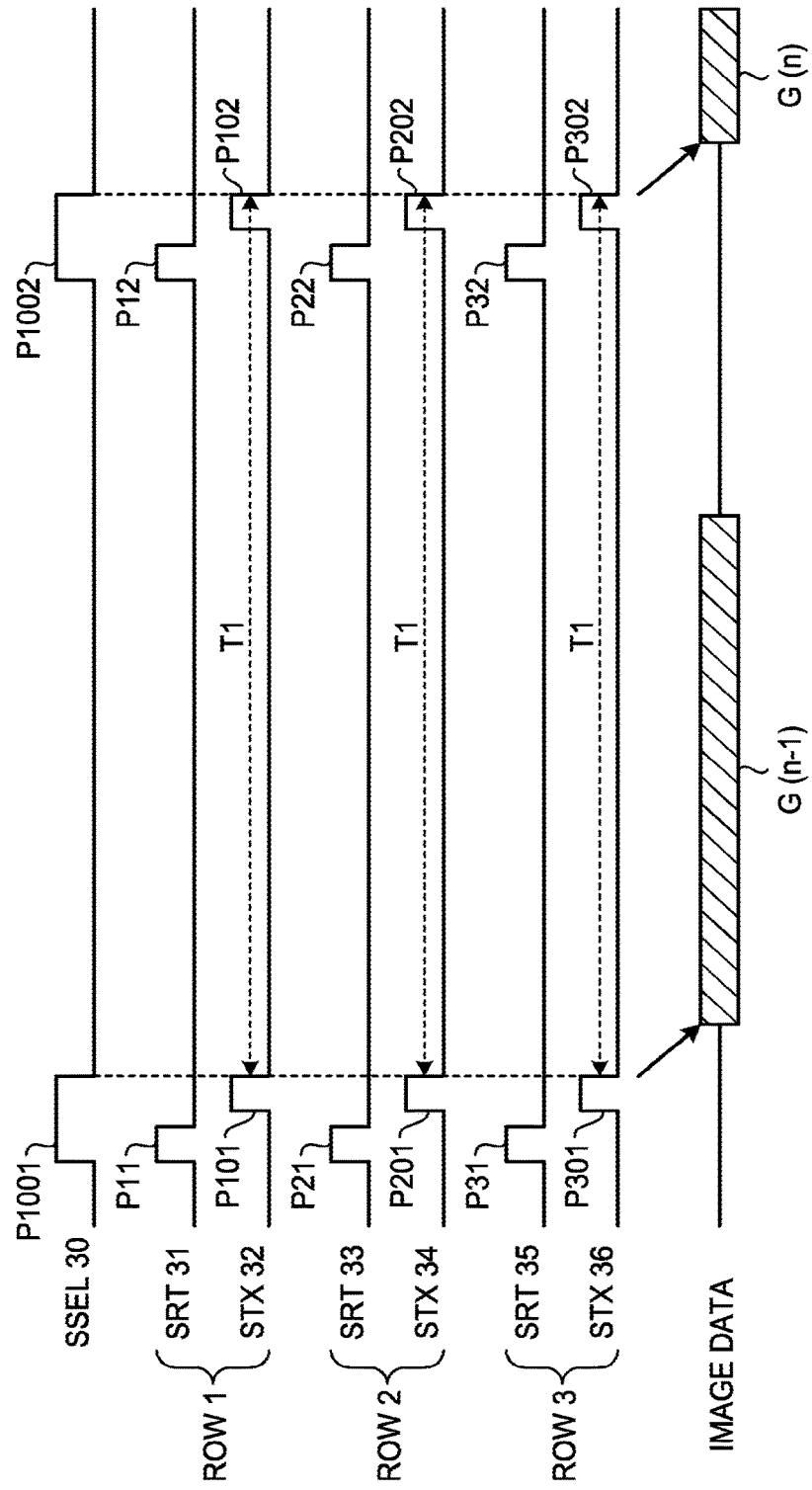
FIG. 3 is a timing chart illustrating a first operating example of the imaging device.

Operation of the imaging device 1 will be described. FIG. 3 is a timing chart illustrating a first operating example of the imaging device 1. At the SSEL 30 in FIG. 3, the timing of turn-on and turn-off of the SEL 210 that is common to all the rows including rows 1, 2, and 3 is illustrated. At the SRT 31, 33, and 35, the timing of turn-on and turn-off of the RT 206 in the rows 1, 2, and 3, respectively, is illustrated. At the STX 32, 34, and 36, the timing of turn-on and turn-off of the TX 202 in the rows 1, 2, and 3, respectively, is illustrated. Each timing is illustrated such that a high level indicates turn-on (hereinafter also referred to as the on state), and a low level indicates turn-off (hereinafter also referred to as the off state).

The signals in the rows 1, 2, and 3 indicate the on and off states of the switches from an end of last image data acquisition period (n−1th time image data acquisition period) to the subsequent nth time image data acquisition period, where n is an integer larger than or equal to two.

In the row 1, for example, the first pulse P11 of the SRT 31 indicates the on state of the RT 206 in the n−1th time image data acquisition period, and the first pulse P101 of the STX 32 indicates the on state of the TX 202 in the same n-1th time image data acquisition period. The second pulse P12 of the SRT 31 indicates the on state of the RT 206 in the nth time image data acquisition period, and the second pulse P102 of the STX 32 indicates the on state of the TX 202 in the same nth time image data acquisition period. In the first operating example, the RT 206 and the TX 202 are turned on only once in a single image data acquisition period.

An interval from immediately after the readout of a pixel signal from the imaging element 20 to immediately after the readout of a next pixel signal from the same imaging element 20 corresponds to an "image data acquisition interval", and this period is referred to as a "single image data acquisition period" in the present description. In FIG. 3, a period from the trailing edge of the first pulse P101 to the trailing edge of the second pulse P102 indicated in the STX 32 corresponds to the length of a "single image data acquisition period".

Accumulation Period

An accumulation period is described. The signal level of the FD 204 is reset by the first pulse P11 of the SRT 31. Subsequently, all the charge accumulated in the PD 200 is transferred to the FD 204 by the first pulse P101 of the STX 32. By an application of the first pulse P1001 of the SSEL 30, a signal level based on the charge transferred to the FD 204 is amplified at the SF 208 and is output as an n-1th time pixel signal. Image data G(n-1) of the n-1th time operation indicated in "IMAGE DATA" in FIG. 3 represents time for outputting image data configured by the pixel signals generated in the n-1th time operation. Image data G(n) of the nth time operation in FIG. 3 represents time for outputting image data configured by the pixel signals generated in the nth time operation.

In the nth time image data acquisition period, the accumulation period for accumulating charge in the PD 200 starts at the trailing edge of the first pulse P101 of the STX 32 and ends at the trailing edge of the second pulse P102, at which the transfer of the charge accumulated in the PD 200 during the period from the trailing edge of the first pulse P101 to the trailing edge of the second pulse P102 to the FD 204 is completed. In other words, the period from the trailing edge of the first pulse P101 to the trailing edge of the second pulse P102 corresponds to an accumulation period T1 (nth time accumulation period) of the PD 200 in the nth time image data acquisition period. The accumulation periods T1 are the same in image data acquisition periods. In the first operating example, the accumulation period T1 corresponds to the entire period of the "single image data acquisition period".

In the first operating example, as illustrated in FIG. 3, the timings of on and off of the switches coincide between the rows. Thus, charge is accumulated in the same period between the rows, that is, in the entire imaging elements 20. All the imaging elements 20 receive light in the same period of time and output photo-generated charge as pixel signals, and the pixel signals can be read as image data.

Operation of Control Circuit

In the first operating example illustrated in FIG. 3, the control circuit 18 operates in the following manner. The n-1th time operation in the row 1 is described as an example. The control circuit 18 outputs a single pulse (corresponding to the first pulse P11 of the SRT 31) to the RT 206 in the n-1th time image data acquisition period to turn on the RT 206, thereby initializing the FD 204. The control circuit 18 then outputs a single pulse (corresponding to the first pulse P101 of the STX 32) to the TX 202 to turn on the TX 202, thereby transferring the charge generated by the PD 200 in the n-1th time accumulation period (corresponding to the accumulation period T1) to the FD 204. The control circuit 18 outputs a single pulse (corresponding to the first pulse P1001 of the SSEL 30) to the SEL 210 in advance to turn on the SEL 210 as illustrated in FIG. 3.

With this operation, the control circuit 18 causes a pixel signal obtained by amplifying the signal level of the FD 204 to be output in the period in which the SEL 210 is on, thereby outputting the pixel signal as image data. The control circuit 18 may output the pulse P1001 to the SEL 210 in the nth time accumulation period T1 (but before the output of the pulse P12).

In the first operating example as discussed above, the PD 200 sequentially converts light into charge throughout a single image data acquisition period, and the TX 202 is turned on once to transfer the accumulated charge from the PD 200 to the FD 204.

The PD 200 has a charge saturation limit to charge generated by photoelectric conversion. To prevent an amount of charge generated in the PD 200 in a light-receiving period from exceeding the saturation limit, it is desirable that the accumulation period T1 is set such that the PD 200 receiving light of a color (red, in this example) to which the PD 200 is most sensitive will not exceed the saturation limit.

Second Operating Example

As described in the first operating example, the amount of charge generated in the PD 200 in a light-receiving period needs to be kept below the saturation limit. In addition to the saturation limit of the PD 200, the FD 204 has a charge storage capacity. When an amount of charge transferred from the PD 200 to the FD 204 exceeds the charge storage capacity, the excess charge remains in the PD 200. Thus, the signal level of the FD 204 needs to be reset before the amount of charge in the FD 204 reaches the charge storage capacity.

Figure 4:
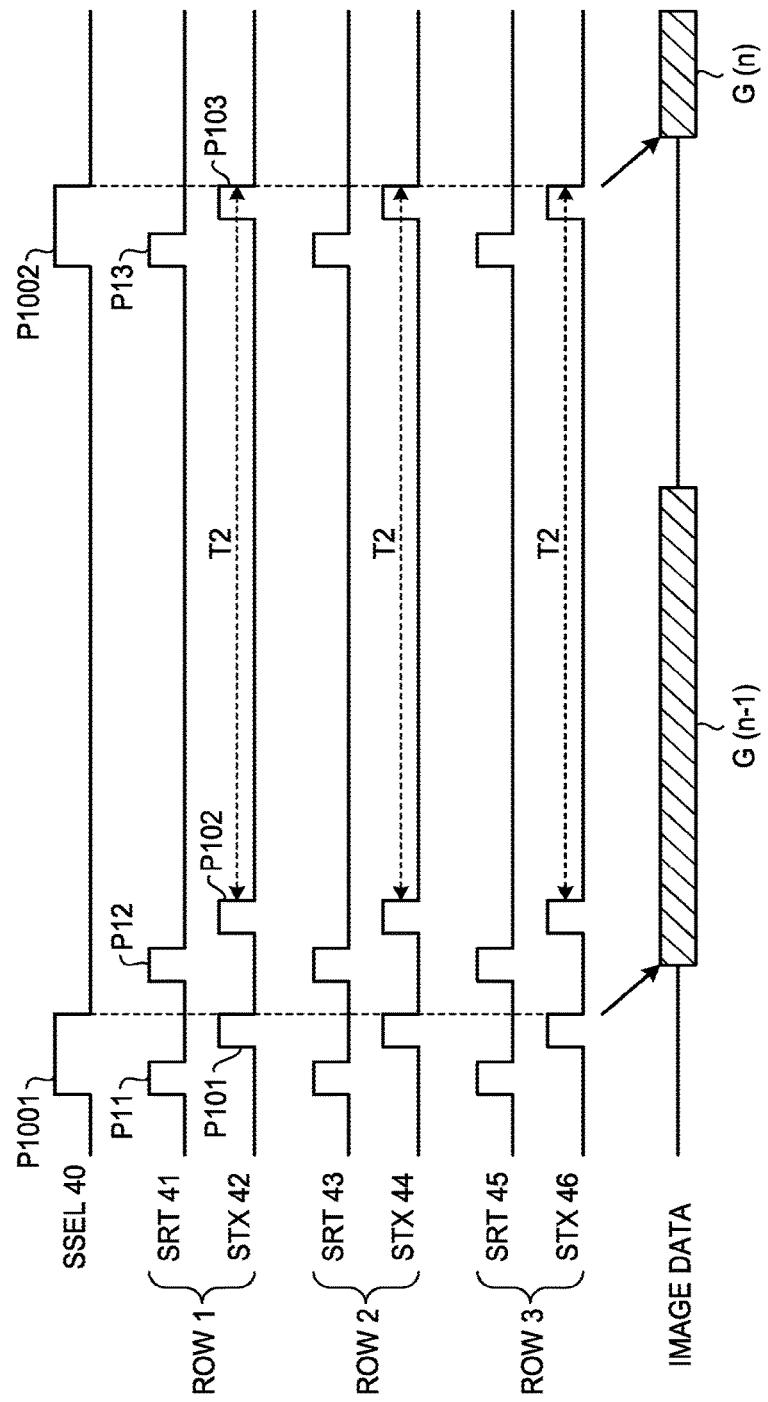
FIG. 4 is a timing chart illustrating a second operating example of the imaging device.

FIG. 4 is a timing chart illustrating the second operating example of the imaging device 1. In the second operating example, the number of times the charge is reset and transferred in a single image data acquisition period is increased from once to a plurality of times. In the second operating example, the number of times is increased to twice, but is not limited to this. The number of times may be increased to three times or four times, for example.

In FIG. 4, a length of a "single image data acquisition period" is the same as in the first operating example for ease of comparison. Thus, the SSEL 40 in FIG. 4 is made the same as the SSEL 30 (see FIG. 3). In the second operating example, a "single image data acquisition period" corresponds to a period from the trailing edge of the first pulse P101 to the trailing edge of the third pulse P103 of the STX 42. The length of a "single image data acquisition period" is the same in other operating examples to be described later.

In the second operating example, the RT 206 and the TX 202 are turned on twice in a "single image data acquisition period". The first turn-on and the second turn-on of the RT 206 and the TX 202 reset the signal level of the FD 204 and transfer the charge from the PD 200 to the FD 204. In the first turn-on, the charge transferred to the FD 204 is discarded. In the second turn-on, the charge transferred to the FD 204 is not discarded but output as a pixel signal. In other words, a single image data acquisition period is configured by a first period in which the charge is discarded and a second period in which the charge is output as a pixel signal.

The second operating example is specifically described with reference to the row 1. The first pulse P11 of the SRT 41 and the first pulse P101 of the STX 42 represent the second turn-on of the RT 206 and the TX 202, respectively, in the n−1th time image data acquisition period. Thus, the charge transferred to the FD 204 after the reset of the FD 204 is output as a pixel signal.

The second pulse P12 of the SRT 41 and the second pulse P102 of the STX 42 represent the first turn-on of the RT 206 and the TX 202, respectively, in the nth time image data acquisition period. The period from the trailing edge of the first pulse P101 to the trailing edge of the second pulse P102 of the STX 42 corresponds to the first period. During the first period, light received by the PD 200 is sequentially converted into charge and all the charge accumulated in the PD 200 is transferred from the PD 200 to the FD 204 upon reception of the second pulse P12 that turns on the RT 206 and the second pulse P102 that turns on the TX 202.

The third pulse P13 of the SRT 41 and the third pulse P103 of the STX 42 represent the second turn-on of the RT 206 and the TX 202, respectively, in the nth time image data acquisition period. The period from the trailing edge of the second pulse P102 to the trailing edge of the third pulse P103 of the STX 42 corresponds to the second period. In the second period that comes after the first period, light received by the PD 200 is sequentially converted into charge and the charge is accumulated in the PD 200 in the same manner as in the first period. Upon reception of the pulse P13, all the charge generated in the first period and retained in the FD 204 is discarded. Upon reception of the pulse P103 output after the pulse P13, all the charge accumulated in the PD 200 in the second period is transferred from the PD 200 to the FD 204. This transferred charge is output as a pixel signal upon reception of the pulse P1002 of the SSEL 40.

Although the second operating example has been described with reference to the row 1, the same also applies to the rows 2 and 3. The operating examples to be described later are also described with reference to the row 1 unless otherwise specifically described.

Accumulation Period

The second period from the trailing edge of the second pulse P102 to the trailing edge of the third pulse P103 of the STX 42 corresponds to an accumulation period T2 in the second operating example. In other words, a part of a "single image data acquisition period" is used as the accumulation period T2. The charge generated in the first period and retained in the FD 204 will not be reflected on the image data, and thus, the first period corresponds to a "non-imaging period".

The accumulation period T2 may be changed as appropriate by moving the second pulse P102 of the STX 42 within the range between the first pulse P101 and the third pulse P103 of the STX 42.

When reset and transfer are performed a plurality of times in the first period, the accumulation period T2 starts from the trailing edge of a pulse of the STX 42 output after the last reset by the SRT 41 in the first period.

In the second operating example, as in the first operating example, the accumulation periods T2 starts and ends at the same time between the rows, and thus, image data based on the light received at the same timing between all the imaging elements 20 can be read.

Retaining Period

Upon reception of the pulse P13, all the charge generated in the first period and retained in the FD 204 is discarded. Upon reception of the pulse P103 output after the pulse P13, all the charge accumulated in the PD 200 in the second period is transferred from the PD 200 to the FD 204. The period after this transfer (after the second or later transfer in a single image data acquisition period) until the leading edge of a next reset pulse corresponds to a "retaining period".

In the second operating example, the duration of the pulse P1002 of the SSEL 40 is overlapped with the duration of the pulse P103 of the STX 42. Thus, all the charge retained in the FD 204 can be output as a pixel signal before the leading edge of the next reset pulse, that is, can be output in the retaining period. The pulse P1002 of the SSEL 40 can be delayed to immediately before the leading edge of the next reset pulse.

Operation of Control Circuit

The control circuit 18 can increase the number of times the reset and the transfer are executed in a single image data acquisition period by adding pulses output in this period.

As described in the second operating example, the control circuit 18 can prevent the amount of charge generated in the PD 200 from exceeding the saturation limit by outputting a pulse for transferring the charge a plurality of times in a single image data acquisition period. As described in the second operating example, the control circuit 18 can reset the signal level of the FD 204 before the amount of charge retained in the FD 204 reaches the charge storage capacity by outputting a pulse for resetting the charge in the FD 204 a plurality of times in a single image data acquisition period.

Third Operating Example

In general, when PDs 200 detect the RGB colors of light, the PDs 200 are less sensitive to a color in the order of R, G, and B. Thus, when the RGB color components of light are converted into charge by the PDs 200 in the same period of time, the PDs 200 generate less amount of charge in the order of R, G, and B.

When a short accumulation period is set so that the PD 200 receiving red light is not saturated, the PD 200 receiving blue light, to which PDs 200 are least sensitive, generates a far smaller amount of charge than the saturation limit. This configuration allows the red-light receiving PD 200 to fully use the dynamic range, but prevents the blue-light receiving PD 200 from generating a sufficient amount of charge. Another operating example improving this is described next.

Figure 5:
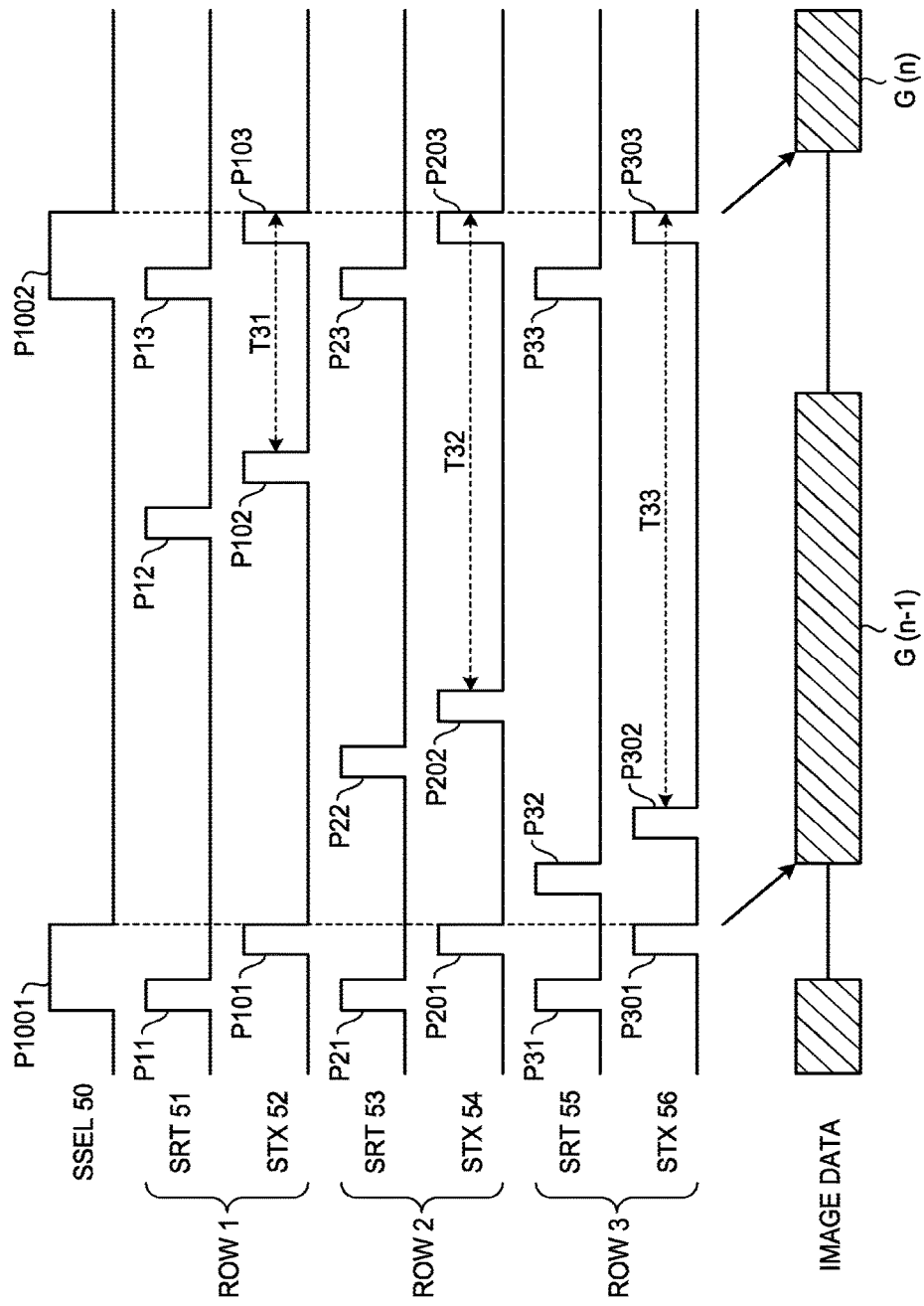
FIG. 5 is a timing chart illustrating a third operating example of the imaging device.

FIG. 5 is a timing chart illustrating a third operating example of the imaging device 1. In the third operating example, imaging elements 20 are classified into pixel groups based on the colors of the color filters, and different accumulation periods between the pixel groups are set for (in this example, different accumulation periods between the pixel group in the row 1, the pixel group in the row 2, and the pixel group in the row 3 are set).

In the third operating example, the timings at which the RTs 206 are turned on first and the timings at which the TXs 202 are turned on first in a single image data acquisition period are varied between the rows (pixel group). Specifically, in the row 1, where red light is received, the second pulse P12 of SRT 51 and the second pulse P102 of STX 52 are shifted backward in time as illustrated in FIG. 5. Thus, an accumulation period T31 in the row 1 is the shortest in the three rows. In the row 2, where green light is received, the second pulse P22 of SRT 53 and the second pulse P202 of STX 54 are shifted backward in time to a smaller extent. Thus, an accumulation period T32 in the row 2 is the second shortest in the three rows. In the row 3, where blue light is received, the second pulse P32 of SRT 55 and the second pulse P302 of STX 56 remain unshifted. Thus, an accumulation period T33 in the row 3 is the longest in the three rows.

In the same manner as described in the first and the second operating examples, the timings at which the TXs 202 are turned on while the SELs 210 are on are the same in all the rows. Thus, the image data are read at the same timing between the rows even though the rows have different accumulation periods.

Accumulation Period

In the third operating example as in the second operating example, the accumulation period (accumulation period T31) in the row 1 corresponds to a period from the trailing edge of the second pulse P102 of the STX 52 to the trailing edge of the third pulse P103 of the STX 52. The accumulation period (accumulation period T32) in the row 2 corresponds to a period from the trailing edge of the second pulse P202 of the STX 54 to the trailing edge of the third pulse P203 of the STX 54. The accumulation period (accumulation period T33) in the row 3 corresponds to a period from the trailing edge of the second pulse P302 of the STX 56 to the trailing edge of the third pulse P303 of the STX 56.

When, for example, the same number of pulses are added to the SRT 51 and the STX 52 in the row 1 between the second pulse P12 and the third pulse P13 and between the second pulse P102 and the third pulse P103, respectively, the accumulation period corresponds to a period from the trailing edge of the last pulse of the STX 52 output while the SEL 210 is off (output in a period from the trailing edge of the first pulse P1001 to the leading edge of the second pulse P1002 of the SSEL 50) to the trailing edge of the illustrated third pulse of the STX 52 output while the SEL 210 is on (output in the duration of the second pulse P1002 of the SSEL 50).

Operation of Control Circuit

In the third operating example, the control circuit 18 turns on the RT 206 and the TX 202, as a set in this order, twice in a single image data acquisition period. The first turn-on timings of the TXs 202 controlled by the control circuit 18 (timings of the second pulses P102, P202, and P303) are shifted between the rows to make the lengths of the accumulation periods different between the colors (between the pixel groups). In other words, the imaging device 1 can set the accumulation period for each color using the control signals output from the control circuit 18.

As described above, even using imaging elements 20 having the same configuration, the control circuit 18 sets the accumulation period in accordance with the color of received light in the PD 200 so that high dynamic range can be achieved by every imaging element 20 irrespective of the color of received light.

In the third operating example, the control circuit 18 sets the short accumulation period T31 for the imaging elements 20 that process red light to which imaging elements are highly sensitive, and sets the long accumulation period T33 for the imaging elements 20 that process blue light to which imaging elements are less sensitive. With a long accumulation period, the imaging elements that process blue light, to which imaging elements are less sensitive, can convert blue light into more amount of charge, thereby increasing the dynamic range. With a short accumulation period, the imaging elements that process red light, to which imaging elements are highly sensitive, can prevent the amount of generated charge from exceeding the saturation limit, thereby still achieving a high dynamic range. This configuration can correct the difference in sensitivity among the imaging elements 20 that arises because the imaging elements 20 process different colors of light, so as to eliminate the difference in sensitivity.

Fourth Operating Example

The following describes a fourth operating example in which the accumulation period is changed in accordance with the color of light that the imaging elements receive, and the middle points of the accumulation periods for the respective colors are set to coincide.

Figure 6:
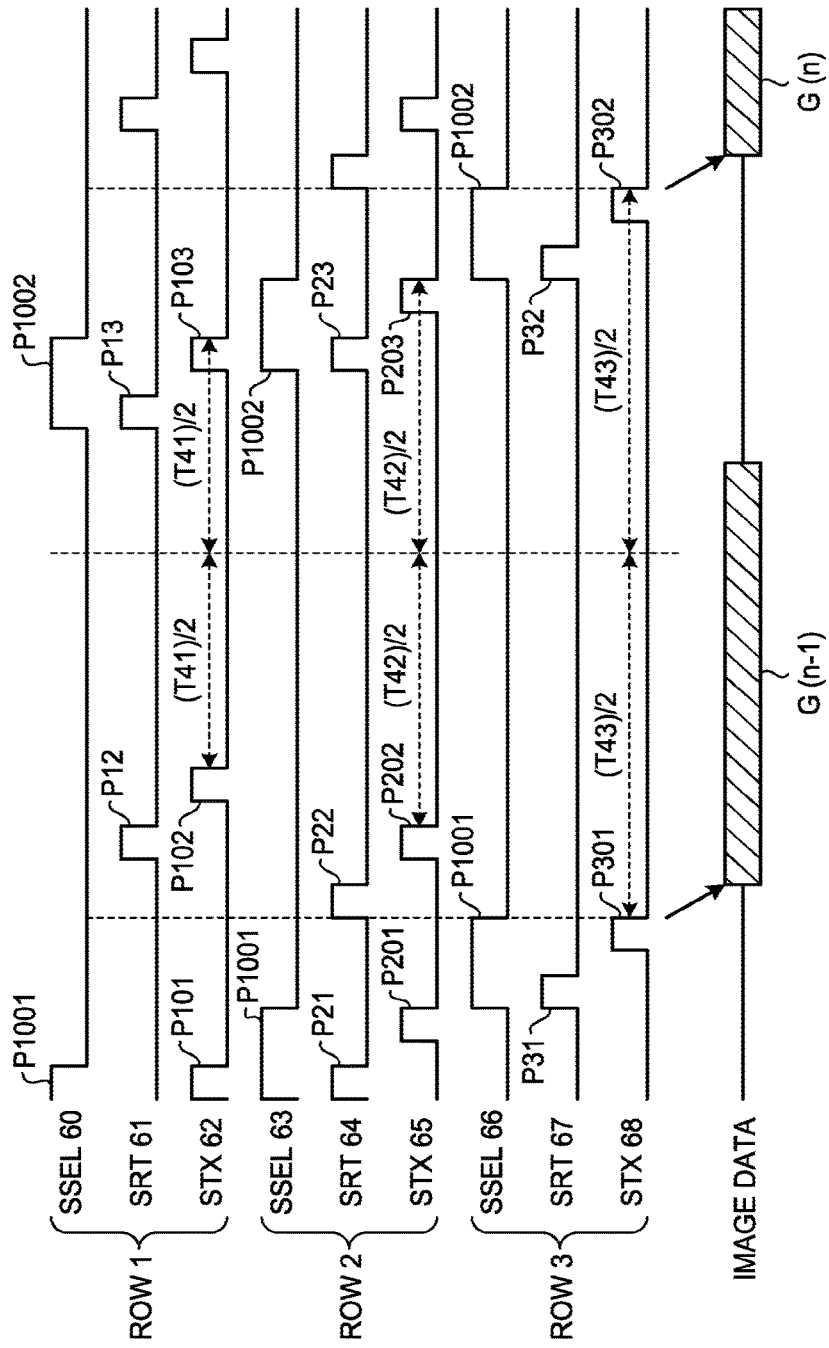
FIG. 6 is a timing chart illustrating a fourth operating example of the imaging device.

FIG. 6 is a timing chart illustrating the fourth operating example of the imaging device 1. In the fourth operating example, the rows 1, 2, and 3 have accumulation periods T41, T42, and T43, respectively. The middle points (T41/2, T42/2, and T43/2) of the respective accumulation periods are aligned on the vertical line denoted by the dashed line.

By contrast to the third operating example, the SELs 210 are also turned on at different timings between the rows. For example, in the row 1, the trailing edge of the pulse P1002 of SSEL 60 coincides with the trailing edge of the third pulse P103 of STX 62. In the row 2, the trailing edge of the pulse P1002 of SSEL 63 coincides with the trailing edge of the third pulse P203 of STX 65. In the row 3, the trailing edge of the pulse P1002 of SSEL 66 coincides with the trailing edge of the second pulse P302 of STX 68. Thus, the timings at which the SELs 210 are turned on are different between the rows.

According to the relation of the turn-on timings of the SELs 210 in the respective rows in the fourth operating example, pixel signals are output from the rows 1, 2, and 3 in this order. Thus, the image data G(n−1) and the image data G(n) are output after the pixel signals are output from the row 3.

Operation of Control Circuit

As illustrated in FIG. 6, for example, the control circuit 18 controls the turn-on timings of the SEL 210, the RT 206, and the TX 202 such that the middle points of the accumulation periods for the respective colors of the PDs 200 coincide.

The turn-on timings of the SSEL 60, SSEL 63, and SSEL 66 are presented for illustrative purposes only, and are not limited to these timings.

When the middle points of the accumulation periods of the pixels in the respective rows (that is, colors) coincide, the pixels of the image data can include more amount of data of light received at the same timing.

In this case, for example, when sequentially captured images in RGB colors are joined to reconstruct an original image, relative positions of image data in RGB colors can be matched, thereby reducing the load incurred in the reconstruction processing.

The first to the fourth operating examples described above are presented for illustrative purposes only, and may be changed as appropriate within the scope of the embodiment above. The following describes examples of modifications.

The signal level of the FD 204 is reset immediately before the charge is transferred from the PD 200, and the charge is transferred from the PD 200 after the signal level of the FD 204 is completely reset. In the row 1 illustrated in FIG. 4, for example, the pulses P11, P12, and P13 of the SRT 41 are set to be output immediately before the pulses P101, P102, and P103 of the STX 42, respectively. With this configuration, the control circuit 18 always causes the RT 206 to initialize the FD 204 immediately before charge is transferred by the TX 202, and thus, the signal level of the FD 204 immediately before charge is transferred from the PD 200 is always at a reset level. To the FD 204 at a reset level, all the charge accumulated in the PD 200 can be transferred, and no residue charge remains in the PD 200.

When the PD 200 has residue charge accumulated in the first period at the beginning of the second period, the reset and transfer may be performed a plurality of times before the second period starts. In other words, operation of transferring charge accumulated in the PD 200 to the FD 204 and resetting and discarding the transferred charge may be repeated a plurality of times in the first period. In the row 1 illustrated in FIG. 4, for example, a plurality of sets of a reset pulse and a transfer pulse may be added between the pulse P12 of the SRT 41 and the pulse P102 of the STX 42. When the first period can be shortened, a plurality of reset pulses may be added between the pulses P12 and P13 of the SRT 41, and a plurality of transfer pulses corresponding to the respective reset pulses added to the SRT 41 may be added between the pulses P102 and P103 of the STX 42. In this case, the accumulation period starts from the trailing edge of a transfer pulse, among the added pulses, output immediately before the pulse P103.

Positional relations between the pulse of SSEL and the pulses of the SRT and STX are presented for illustrative purposes only, and may be changed as appropriate. In the row 1 illustrated in FIG. 4, for example, the first pulse P1001 of the SSEL 40 may be disposed in a period from the trailing edge of the first pulse P101 of the STX 42 to the leading edge of the second pulse P12 of the SRT 41.

The TX 202 may be kept in the on state in periods other than the accumulation periods. When the TX 202 is kept in the on state, the charge generated in the PD 200 can be always transferred to the FD 204. If, however, the PD 200 generates an amount of charge that may exceed the charge storage capacity that can be transferred to the FD 204, charge that could not be transferred to the FD 204 may remain in the PD 200. In this case, the FD 204 is initialized by turn-on of the RT 206 and the charge retained in the FD 204 is discarded before an amount of charge exceeding the charge storage capacity is transferred to the FD 204.

The control circuit 18, for example, may set a long image data acquisition interval and set a short accumulation period, to transfer, to the FD 204, the charge accumulated in the PD 200 in a period other than the accumulation period in batches.

The SF 208 may have a multi-stage configuration. The SEL 210 is an example of a "control switch". The circuit configuration may be changed to other circuit configuration as long as a constant current circuit is achieved.

The imaging device may set an accumulation period for each pixel unit or for each pixel group. Although the accumulation period is set for each row (pixel group) as an example, the accumulation period may be set for each pixel. The rows of red, green, and blue in a linear sensor are described as an example of the pixel groups, but the pixel groups are not limited to this. Pixels in a Bayer array may be classified into certain pixel groups based on the colors of the pixels.

Although the pixel groups are classified based on the colors of the pixels, the configuration of the pixel groups is not limited to this. The pixels may be classified into pixel groups based on the photoelectric conversion characteristic of the PD 200 in each pixel. For example, pixels having a better photoelectric conversion characteristic than a certain reference level may be classified into a first pixel group, and pixels having a lower photoelectric conversion characteristic than the reference level may be classified into a second pixel group.

The imaging elements are provided with different color filters and the elements are classified into a pixel group that receives red light, a pixel group that receives green light, and a pixel group that receives blue light, but each imaging element may directly receive any one of red light, green light, and blue light separated from white light.

According to the operations described in the first to the fourth operating examples, and all the modifications contained in the technical concepts, and configurations including the modifications, difference in sensitivity among pixel groups can be corrected, and an influence of charge generated in a non-imaging period can be reduced.

According to an embodiment, difference in sensitivity among pixel groups can be corrected, and an influence of charge generated in a non-imaging period can be reduced.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

The method steps, processes, or operations described herein are not to be construed as necessarily requiring their performance in the particular order discussed or illustrated, unless specifically identified as an order of performance or clearly identified through the context. It is also to be understood that additional or alternative steps may be employed.

Further, any of the above-described apparatus, devices or units can be implemented as a hardware apparatus, such as a special-purpose circuit or device, or as a hardware/software combination, such as a processor executing a software program.

Further, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, non-volatile memory, semiconductor memory, read-only-memory (ROM), etc.

Alternatively, any one of the above-described and other methods of the present invention may be implemented by an application specific integrated circuit (ASIC), a digital signal processor (DSP) or a field programmable gate array (FPGA), prepared by interconnecting an appropriate network of conventional component circuits or by a combination thereof with one or more conventional general purpose microprocessors or signal processors programmed accordingly.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:

1. An imaging device comprising a plurality of arranged imaging elements,
each of the plurality of imaging elements comprising:

a light-receiving element configured to generate charge from received light by photoelectric conversion, a floating diffusion configured to convert the charge generated by the light-receiving element into voltage, a charge transfer switch configured to transfer the charge from the light-receiving element to the floating diffusion, a reset switch configured to reset the voltage of the floating diffusion, and a source follower configured to amplify the voltage of the floating diffusion, the reset switch being configured to reset the voltage of the floating diffusion a plurality of times for each of predetermined pixel groups in a single image data acquisition period, and the charge transfer switch being configured to transfer the charge from the light-receiving element to the floating diffusion a plurality of times for each of the pixel groups in the single image data acquisition period.

2. The imaging device according to claim 1, wherein the reset switch is configured to reset the voltage of the floating diffusion immediately before the charge transfer switch transfers the charge from the light-receiving element to the floating diffusion.

3. The imaging device according to claim 1, wherein filters are disposed for the plurality of imaging elements such that the light-receiving element in each of the plurality of imaging elements receives light having any one of colors of red, green, and blue, and the plurality of imaging elements are classified into the pixel groups, one group for each of the colors of the received light.

4. The imaging device according to claim 1, further comprising a control unit configured to control timing at which the reset switch resets the voltage of the floating diffusion and timing at which the charge transfer switch transfers the charge from the light-receiving element to the floating diffusion.

5. The imaging device according to claim 1, further comprising a control switch configured to activate operation of the source follower for amplifying the voltage of the floating diffusion and outputting the amplified voltage, wherein the control switch is configured to activate the operation before end of a retaining period during which the floating diffusion retains the charge transferred in one of the plurality of times of transfers performed in the single image data acquisition period.

6. The imaging device according to claim 5, wherein the control unit is configured to further control timing at which the control switch activates the operation.

7. The imaging device according to claim 5, wherein the retaining period corresponds to a period after charge accumulated in the light-receiving element during an accumulation period starting after a second or later transfer is transferred to the floating diffusion until next reset.

8. The imaging device according to claim 7, wherein the accumulation period is different between the pixel groups.

9. The imaging device according to claim 1, wherein the control unit is configured to control operation timing of the reset switch and operation timing of the charge transfer switch such that middle points of periods during each of which the light-receiving element in one of the plurality of imaging elements accumulates charge coincide.

* * * * *